United States Patent [19]

Houston

[11] Patent Number: 4,985,865
[45] Date of Patent: Jan. 15, 1991

[54] ASYMMETRICAL DELAY FOR CONTROLLING WORD LINE SELECTION

[75] Inventor: Theodore W. Houston, Richardson, Tex.

[73] Assignee: Texas Instruments Incorporated, Dallas, Tex.

[21] Appl. No.: 288,505

[22] Filed: Dec. 21, 1988

[51] Int. Cl.[5] .............................. G11C 7/00
[52] U.S. Cl. ........................................ 365/194
[58] Field of Search ..................... 365/194, 233.5

[56] References Cited

U.S. PATENT DOCUMENTS

| | | | |
|---|---|---|---|
| 4,165,540 | 8/1979 | Vinot | 365/194 |
| 4,656,612 | 4/1987 | Allan | 365/194 |
| 4,803,665 | 2/1989 | Kasa | 365/194 |
| 4,905,192 | 2/1990 | Nogami et al. | 365/194 |

FOREIGN PATENT DOCUMENTS 146088  8/1983  Japan ........................... 365/194

OTHER PUBLICATIONS

"Two 13-ns 64k CMOS SRAM's with Very Low Active Power and Improved Asynchronous Circuit Techniques," by Flannagan et al., IEEE Journal of Solid-State Circuits, vol. SC-21, No. 5, Oct. 86, pp. 692-703.

Primary Examiner—Stuart N. Hecker
Assistant Examiner—Michael A. Whitfield
Attorney, Agent, or Firm—Jim Comfort; Melvin Sharp; Stanton C. Braden

[57] ABSTRACT

Asymmetrical delay circuitry comprising a chain of inverters connected to logic gates is disclosed which can be implemented at the word line driver or in the address decode circuitry of a memory.

8 Claims, 4 Drawing Sheets

ASYMMETRICAL DELAY FOR CONTROLLING WORD LINE SELECTION

FIELD OF THE INVENTION

This invention is in the field of semiconductor memories and was made with the support of the U.S. Government under contract number DNA 001-86-0090 awarded by the Defense Nuclear Agency.

BACKGROUND OF THE INVENTION

In selecting and deselecting word lines in a memory, such as a static random access memory (SRAM), the prior art has used asymmetry in drive strength of inverters in word line selection such that greater drive strength is used in deselecting word line as compared with selecting word lines. For instance, in a scheme wherein an inverter comprising a p-channel transistor connected to an n-channel transistor is used to drive a word line, the n-channel transistor may be larger than the p-channel transistor. Thus, greater drive strength will be used in deselecting word lines. A schematic drawing of one example of this prior art scheme is illustrated in FIG. 1. FIG. 1 shows p-channel transistor 2 which is connected to n-channel transistor 4 as being half as large as n-channel transistor 4. This is indicated by the $\frac{1}{2} \times$ next to transistor 2 and the $\times$ next to transistor 4. As shown, transistors 2 and 4 share a common gate as well as share common outputs which drive a word line. The source of transistor 2 is at voltage Vdd while the source of transistor 4 is at ground. One major disadvantage in using schemes with asymmetry in drive strength arises because of its insensitivity to parameter variations, such as changes in temperature, threshold voltage and etc. Also, asymmetries in drive strength result in inverters which are not designed for maximum noise margin and which will not have optimum performance in a transient dose environment.

OBJECTS OF THE INVENTION

It is an object of the invention to provide a new and improved scheme for selecting and deselecting word lines in a memory.

It is an object of the invention to provide new and improved asymmetrical delay circuitry.

SUMMARY OF THE INVENTION

The invention uses an asymmetrical delay circuit in word line selection circuitry. For instance, an asymmetrical delay circuit can either NAND or NOR a signal with that same signal delayed by a predetermined time. The delay causes the asymmetry and response which results from the rise of a signal relative to the fall of that signal. The delay is adjusted so that all word lines are deselected for a portion of the bit line precharge/equalization segment of the memory timing cycle.

DETAILED DESCRIPTION OF THE INVENTION

Figure 1:
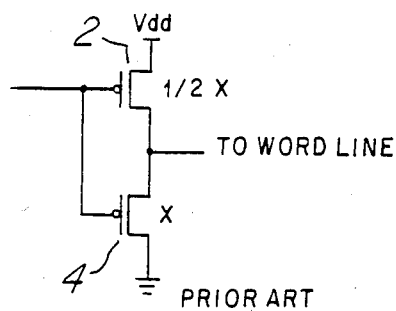
FIG. 1 is a schematic drawing of a prior art scheme.
Figure 2A:
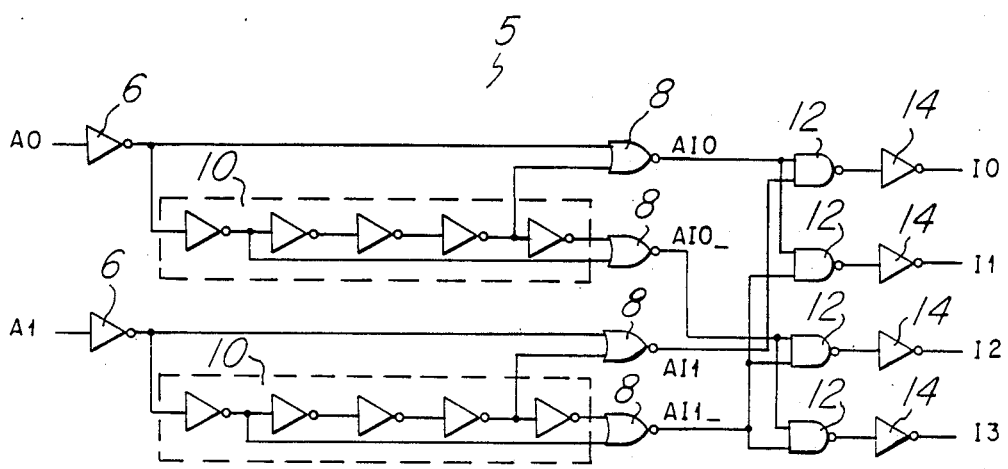
FIG. 2a a schematic drawing of a preferred embodiment of the invention.

The invention selects and deselects word lines through the use of an asymmetrical delay circuit. FIG. 2a is a schematic drawing of a preferred embodiment of the invention which uses two inputs which produce four outputs that each control an associated word line driver. Note that more inputs and thus more outputs are contemplated. For example, n inputs will produce $2^n$ outputs. With reference to FIG. 2a, A0 and A1 are inputs of asymmetrical delay circuit 5. A0 and A1 are each input to an associated inverter 6, whose output is connected to both an associated NOR gate 8 and an inverter chain 10 of a predetermined number. The output from an inverter of even number in chain 10 is connected to another input of NOR gate 8. The output of the fourth inverter in the chain is connected to NOR gate 8. The output of the last inverter in chain 10 is input to NOR gate 12. Additionally, the output of an inverter of odd number in chain 10 is connected to another input of NOR gate 12. The output of the first inverter is input to NOR gate 12. The output of each NOR gate 8 forms an intermediate input while the output of each NOR gate 12 originating from the same input forms an intermediate input which is its logical complement. Thus, AI0, AI1 and their respective logic complements AI0_ and AI1_ are formed. Each intermediate input is grouped with an intermediate complement resulting from a different input. Each group is input to an associated NAND gate 13. The outputs of each NAND gate 13 are input to an associated inverter 14. Each output of inverter 14 forms an input of a word line driver. Thus, word line driver inputs I0, I1, I2 and I3 are formed.

Figure 2B:
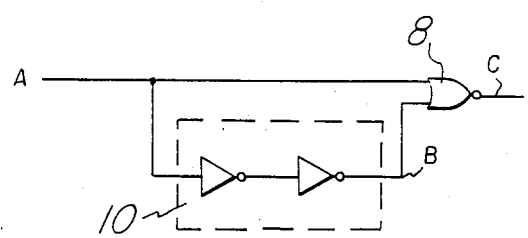
FIG. 2b and 2c are prior art schematic and timing diagram drawings respectively illustrating the timing delay introduced at selected points in the delay circuit.
Figure 2C:
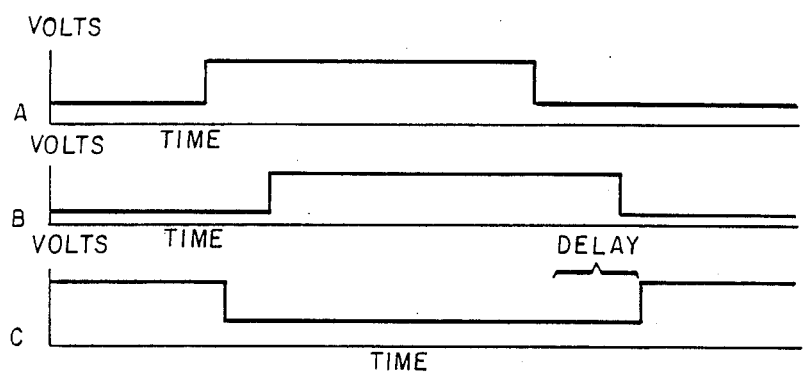

The desired delay given by the asymmetrical delay circuitry can be controlled by increasing or decreasing the number of inverters in the inverter chain. For example, with two inverters in the chain in the logic schematic of FIG. 2b (which shows elements 6, 8 and 10 as connected in FIG. 2a), the delay is demonstrated in the timing diagram of FIG. 2c which illustrates voltage vs. time plots at points A, B, and C labeled in FIG. 2b. The delay shown and labeled in FIG. 2c can be increased by increasing the number of inverters in chain 10 and likewise the delay can be decreased by decreasing the number of inverters in the chain. Additionally, capacitors can be placed in parallel with inverters in chain 10 to increase the delay even more.

Figure 3:
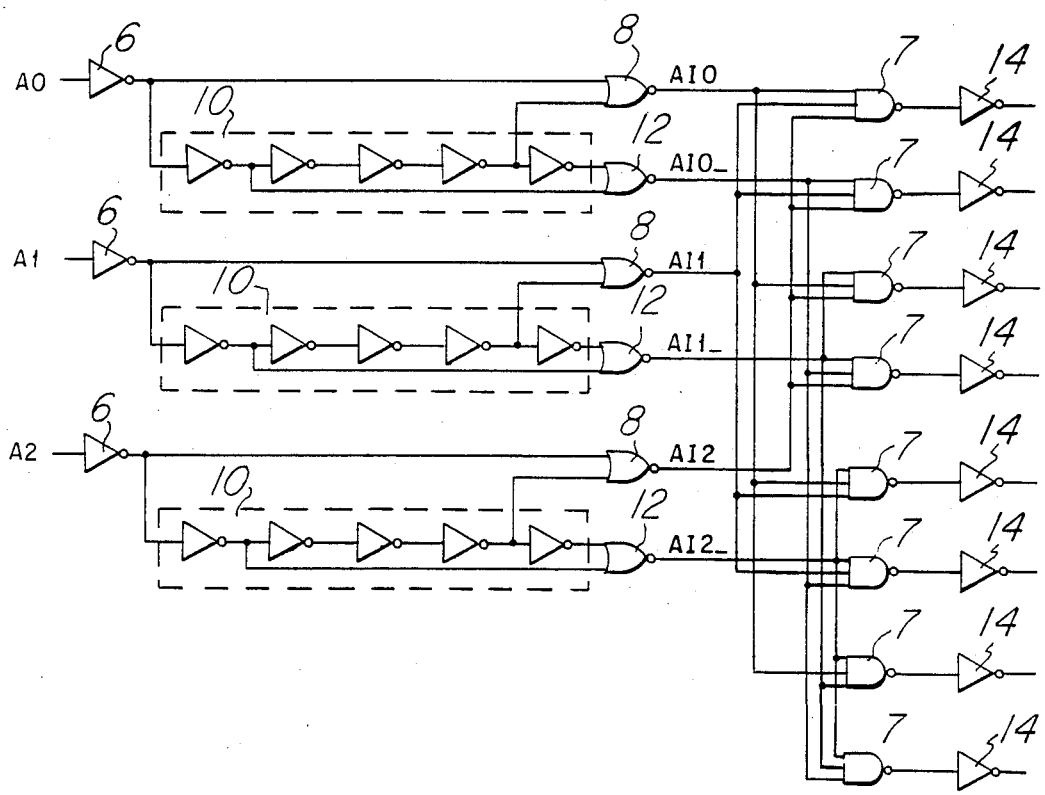
FIG. 3 is a schematic drawing of the invention using three inputs.

An example of the invention using three inputs, A0, A1 and A2 (with NAND gate 7 substituted for NOR gates) is illustrated in FIG. 3. As shown, combinations of intermediate inputs AI0, AI1, AI2, AI0_, AI1_ and AI2_ produce word line driver inputs I0 through I7.

Figure 4:
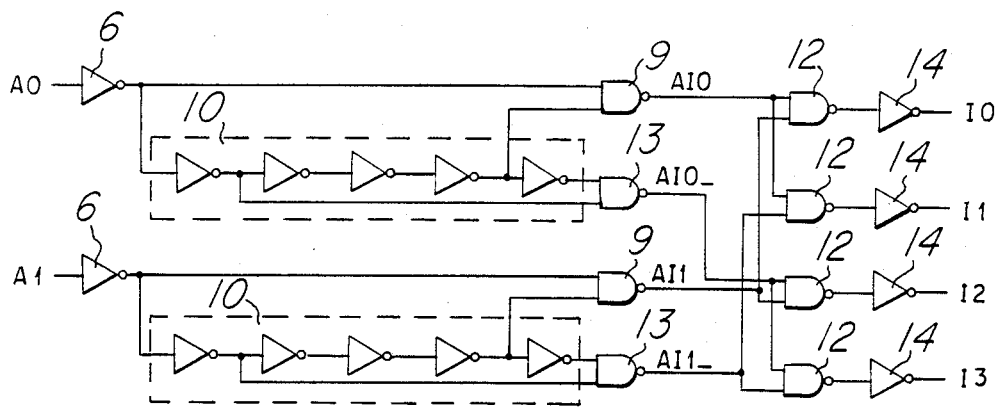
FIG. 4 is a schematic drawing of an alternative embodiment of the invention which substitutes NAND gates for NOR gates.

An alternative embodiment of the invention substitutes NAND gate 9 for NOR gate 8 and NAND gate 15 for NOR gate 12 as shown in FIG. 4.

Figure 5:
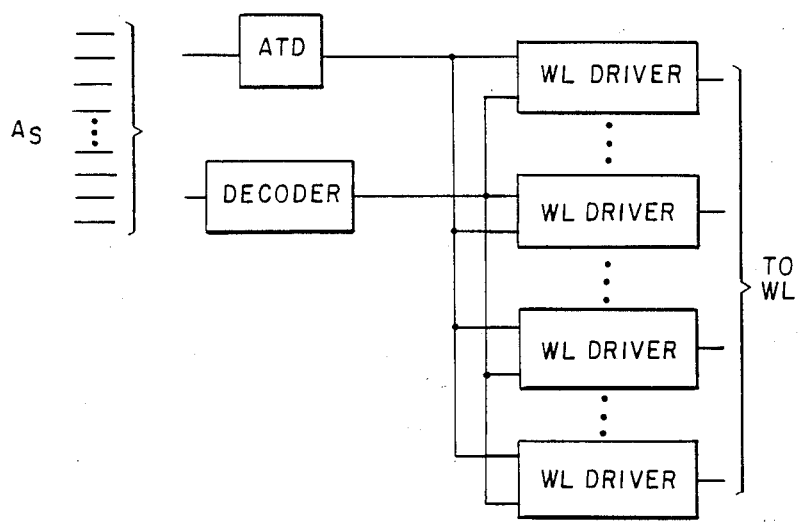
FIGS. 5 and 6 are diagrams illustrating additional implementations of the asymmetrical delay circuitry with word line drivers.

The above described asymmetrical delay circuitry can be connected to the word line drivers in a one-to-one correspondence. However, this results in excess overhead. A more space efficient scheme is shown in diagram of FIG. 5. In FIG. 5, the inputs As are sent to an address transition detector ATD (used primarily to control bit line and/or sense amplifier precharge timing) and to a decoder wherein the ATD and decoder are connected to each word line (WL) driver. Each word line driver as shown is connected to a respective word line. The asymmetrical delay circuitry can be incorporated in the single decoder, thereby minimizing overhead.

A pulse from the ATD can gate the word lines to control their operation on and off and to keep the word lines off during a precharge and equalization of bit lines to lower power. The use of the ATD to gate the word lines has the advantage of lower power and avoiding overlap in time of activated word lines. Furthermore, this scheme avoids word line wiggling with address skew (or noise on the address). However, the use of the ATD to gate the word lines has a race condition if the address decode is faster than the ATD pulse turning off the word lines. There may also be a rising blip on the newly selected word line before it is turned off by the ATD pulse. This could lead to memory cell upset if the blip is big enough and comes before bit lines are precharged. The asymmetrical delay in the address decode, word line driver path can serve the same function as using the ATD pulse to control the word lines. This method does not have the race condition described above. Also, if the asymmetrical delay is put in the address decode, no NANDS or NORS are put in the word line driver path, which is an advantage considering the number of word lines and the word line capacitance. Alternatively, the asymmetrical delay in the address decode word line driver path can be used in conjunction with the ATD control to relieve the above described race condition.

Figure 6A:
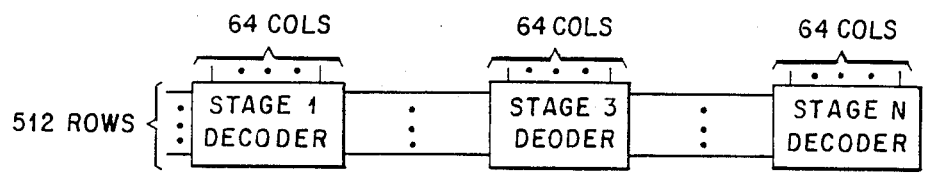
Figure 6B:
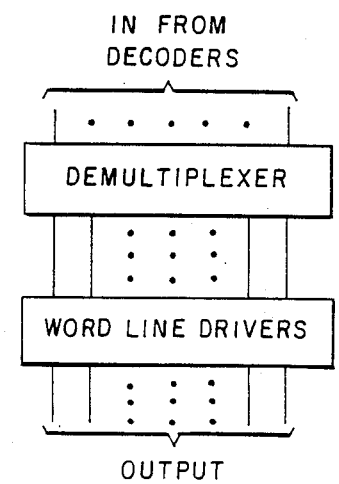

The asymmetrical delay circuitry of the invention can be placed within selected stages of a multistaged decoding scheme. For example, FIG. 6 illustrates a diagram of a decoding scheme with N (N=an integer) decoders wherein the asymmetrical delay circuitry exists within each decoder. The N decoders are connected to a demultiplexer which is connected to word line drivers. As shown, the decoders process 512 rows by 64 columns of addresses. Note, however, that a large number of possibilities exist for the number of columns and rows which may be processed by the decoders and that those shown in FIG. 6 are provided as an example only. The demultiplexer receives the decoders' outputs and through its connection to the word line driver, drives selected word lines.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

I claim:

1. A word line driver control circuit comprising:
   first and second logic gates;
   an inverter chain, comprising a plurality of series connected inverters, having its output connected to said second logic gate;
   a circuit input connected both to said first logic gate and to said inverter chain;
   a first output of a first inverter in said inverter chain connected to said first logic gate, said first output having a logic state the same as the logic state of the input to said inverter chain;
   a second output of a second inverter in said inverter chain connected to said second logic gate, said second output being other than the output of said inverter chain, and having a logic state that is the complement of the logic state of the input to said inverter chain, whereby the output of said second logic gate is the logical complement of the output of said first logic gate.

2. The word line driver control circuit as defined in claim 1, wherein said logic gates are NOR gates.

3. The word line driver control circuit as defined in claim 1, wherein said logic gates are NAND gates.

4. Word line selection circuitry for forming $2^n$ word line inputs from circuit inputs comprising:
   associated with each of said n circuit inputs:
   first and second logic gates;
   an inverter chain having its output connected to said second logic gate;
   each circuit input connected to its associated first logic gate and to its associated inverter chain;
   a first output of a first inverter in said inverter chain connected to said first logic gate, said first output having a logic state the same as the logic state of the input to said inverter chain;
   a second output of a second inverter in said inverter chain connected to said second logic gate, said second output being other than the output of said inverter chain, and having a logic state that is the complement of the logic state of the input to said inverter chain;
   combining means for logically combining the output of at least said first logic gate associated with one of said n circuit inputs with the output of at least one of said first or second logic gates associated with another of said n circuit inputs.

5. The word line selection circuitry as defined in claim 4, wherein said combining means comprises: a third logic gate having as its inputs the outputs of said first or second logic gates associated with each of said circuit inputs.

6. The word line selection circuitry as defined in claim 5, wherein said combining means further comprises a plurality of said third logic gates operably connected to said first or second logic gates associated with each of said circuit inputs, said plurality being equal to $2^n$, where n is an integer equal to the number of circuit inputs.

7. Word line selection circuit comprising:
   n circuit input where n is an integer;
   $2^n$ word line drivers;
   an address transition detector connected between said circuit inputs and said word line drivers;
   a decoder connected between said circuit inputs and said word line drivers; said decoder including associated with each of said n circuit inputs:
   first and second logic gates;
   an inverter chain having its output connected to said second logic gate;
   each circuit input connected to its associated first logic gate and to its associated inverter chain;
   a first output of a first inverter in said inverter chain connected to said first logic gate, said first output having a logic state the same as the logic state of the input to said inverter chain;

a second output of a second inverter in said inverter chain connected to said second logic gate, said second output being other than the output of said inverter chain, and having a logic state that is the complement of the logic state of the input to said inverter chain;

combining means for logically combining the output of at least said first logic gate associated with one of said n circuit inputs with the output of at least one of said first or second logic gates associated with another of said n circuit inputs.

8. The word line selection circuitry as defined in claim 7, wherein said combining means comprises a plurality of third logic gates operably connected to said first or second logic gates associated with each of said circuit inputs, said plurality being equal to $2^n$, where n is an integer equal to the number of circuit inputs.

* * * * *